United States Patent [19]

Tsuchiya et al.

[11] Patent Number: 4,684,671
[45] Date of Patent: Aug. 4, 1987

[54] ENERGY BEAM CURABLE COMPOSITION

[75] Inventors: Hiroshi Tsuchiya; Kazuhiko Morio; Hisashi Murase; Kazuo Ohkawa, all of Tokyo, Japan

[73] Assignee: Asahi Denka Kogyo K.K., Tokyo, Japan

[21] Appl. No.: 855,310

[22] PCT Filed: Mar. 18, 1986

[86] PCT No.: PCT/JP86/00133

§ 371 Date: Apr. 9, 1986

§ 102(e) Date: Apr. 9, 1986

[51] Int. Cl.$^4$ ............... C08G 59/72; C08G 59/68; C08G 59/62
[52] U.S. Cl. .................. 522/31; 430/280; 430/921; 522/170; 556/76; 556/80; 560/255; 568/6; 568/13; 568/48; 568/49; 568/53
[58] Field of Search ............... 522/31; 568/6, 13; 556/76, 80; 430/280, 921

[56] References Cited

U.S. PATENT DOCUMENTS

| | | | |
|---|---|---|---|
| 2,807,648 | 9/1957 | Pitt | 568/74 |
| 4,026,705 | 5/1977 | Crivello | 522/31 |
| 4,166,478 | 7/1979 | Crivello | 568/58 |
| 4,173,476 | 11/1979 | Smith | 522/31 |
| 4,193,799 | 3/1980 | Crivello | 522/31 |
| 4,231,951 | 11/1980 | Smith | 556/80 |
| 4,291,114 | 9/1981 | Berggren | 522/110 |
| 4,374,066 | 2/1983 | Crivello | 568/13 |
| 4,544,732 | 10/1985 | Corley | 528/88 |

FOREIGN PATENT DOCUMENTS

| | | |
|---|---|---|
| 1516352 | 7/1978 | United Kingdom . |
| 1516511 | 7/1978 | United Kingdom . |
| 1516351 | 7/1978 | United Kingdom . |
| 2061280 | 5/1981 | United Kingdom . |

Primary Examiner—John C. Bleutge
Assistant Examiner—Arthur H. Koeckert
Attorney, Agent, or Firm—Flynn, Thiel, Boutell & Tanis

[57] ABSTRACT

There is provided an energy beam curable resin composition which comprises as an essential component a cationically polymerizable substance and an effective amount of an onium salt of a Lewis acid represented the following formula (I).

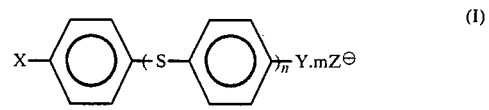

[where X is a sulfonio group represented by the following formula (II)].

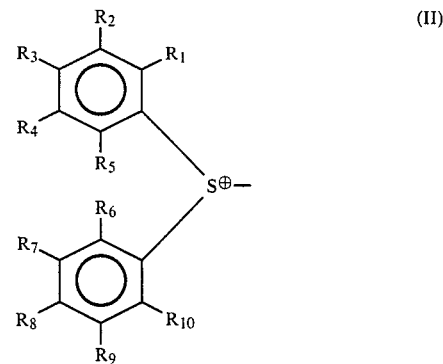

(where at least one of $R_1$–$R_{10}$ is (A) a $C_1$–$C_{18}$ aliphatic group having at least one hydroxyl group or (B) a $C_3$–$C_{19}$ aliphatic group having a group of —OCH$_2$CH$_2$O—).

1 Claim, No Drawings

ENERGY BEAM CURABLE COMPOSITION

FIELD OF INDUSTRIAL APPLICATION

The present invention relates to a composition capable of curing upon irradiation with an energy beam. More particularly, it relates to a resin composition which, when used as a coating material, readily cures and affords a cured coating film which gives off very little odor and bleeds very little decomposition products induced by irradiation.

PRIOR ART AND PROBLEMS THEREOF

Photopolymerizable polymeric materials have been under active study, particularly in the area of coating, from the standpoint of energy saving, space saving, and environmental pollution. However, the polymerization of such materials is based mainly on the radical polymerization of double bonds. For example, an epoxy resin, despite its good physical properties, does not readily undergo photopolymerization without the introduction of double bonds, which is accomplished in actual by the modification with an acrylic compound.

There is disclosed in U.S. Pat. No. 3,794,576 (Feb. 26, 1974) issued to Watt a new photopolymerizable epoxy resin composition having both good rheological properties and capability of rapid curing. This resin composition contains a photosensitive aromatic diazonium salt as a photopolymerization initiator. Upon exposure to light, the diazonium salt decomposes to liberate a Lewis acid which takes part in the polymerization of epoxy resin monomers. The aromatic diazonium salt, however, has a disadvantage of liberating nitrogen gas together with a Lewis acid upon photodecomposition. The nitrogen gas thus liberated causes foaming when the coating film of epoxy resin is thicker than 15 μm. Therefore, it is not suitable for thick coating. Another disadvantage is that an epoxy resin composition containing the diazonium salt gradually cures even in the absence of light. Because of this poor storage stability, the diazonium salt is not suitable for one-pack compositions.

Extensive studies have been made to overcome the above-mentioned disadvantages of the diazonium salt initiator, and improvements were made in thick coating and storage stability. As the result, there were disclosed an aromatic sulfonium salt initiator and an aromatic iodonium salt initiator and a curable resin composition containing it in Japanese Patent Publication Nos. 14278/1977, 14277/1977, and 19581/1984 and Japanese Patent Laid-open No.53181/1979.

The composition containing an aromatic onium salt mentioned above is inferior in curability to the one containing a diazonium salt. Where the aromatic onium salt is an aromatic sulfonium salt, the composition containing it gives off an ill-smelling low-molecular weight compound when irradiated with an energy beam, with the result that the coating film has a foul smell. In order to eliminate this disadvantage, there was proposed a high-molecular weight aromatic sulfonium salt having a specific group in Japanese Patent Laid-open No. 55420/1981. However, it still is not satisfactory although it eliminates the disadvantage to some extent. Upon irradiation, it forms a low-molecular weight compound such as bisphenyl sulfide, which remains in the coating film, causing the film to smell.

It is an object of the present invention to provide an energy beam curable resin composition which is superior in curability and storage stability and, upon irradiation with an energy beam, liberates a very little amount of low-molecular weight compound such as diphenyl sulfide which is not desirable from the standpoint of odor, safety, and film properties.

MEANS TO SOLVE THE PROBLEMS

The object of the invention is achieved by an energy beam curable resin composition which comprises as essential constituents a cation-polymerizable substance and an effective amount of an onium salt of a Lewis acid represented by the following formula (I).

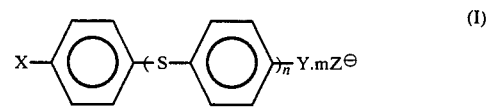

[where X is a sulfonio group represented by the following formula (II).]

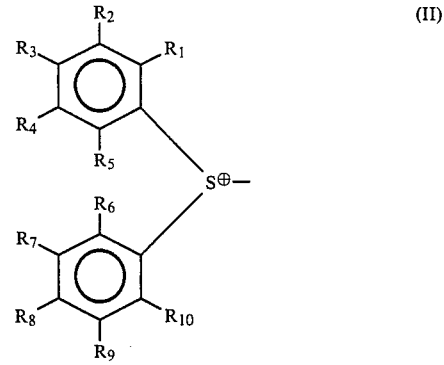

(where $R_1$–$R_{10}$ are each a hydrogen atom, halogen atom, nitro group, alkoxy group, $C_1$–$C_{18}$ aliphatic group, or $C_6$–$C_{18}$ substituted or unsubstituted phenyl, phenoxy, or thiophenoxy group, with at least one of $R_1$–$R_{10}$ being (A) a $C_1$–$C_{18}$ aliphatic group having at least one hydroxyl group or (B) a $C_3$–$C_{19}$ aliphatic group having a group of —OCH$_2$CH$_2$O—.);

Y is a group represented by the above formula (II), hydrogen atom, halogen atom, nitro group, alkoxy group, $C_1$–$C_{18}$ aliphatic group, $C_6$–$C_{18}$ substituted or unsubstituted phenyl, phenoxy, or thiophenoxy group, and n=1–3 and m=1–2; and Z is a group represented by the formula $MQ_l$ (III) or the formula $MQ_{l-1}OH$ (IV). (where M denotes B, P, As, or Sb; Q denotes a halogen atom; and l is an integer of 4 to 6.)]

A cationically polymerizable substance to use in the invention includes epoxy resins, vinyl ethers, cyclic ethers and ketones, oxetanes, lactones, styrenes, acroleins, vinyl arenes (e.g., 4-vinylbiphenyl), alicyclic vinyl compounds (e.g., vinylcyclohexane), spiro-orthoesters, spiro-orthocarbonates, bicyclo-orthoesters, isobutylene, dienes (e.g., butadiene and isoprene), and phenol-formaldehyde resins. They are in the form of monomer or prepolymer. Preferable among them is epoxy resins.

The epoxy resins used in this invention are known aromatic epoxy resins, alicyclic epoxy resins, and aliphatic epoxy resins. Preferred aromatic epoxy resins are a polyglycidyl ether derived from polyhydric phenol having at least one aromatic nucleus or alkylene oxide adduct thereof. Their examples include glycidyl ether resins produced by the reaction between bisphenol A or alkylene oxide adduct thereof and epichlorohydrin, and they also include epoxy-novolac resins. Preferred alicyclic epoxy resins include polyglycidyl ethers derived from a polyhydric alcohol having at least one aliphatic ring, and they also include cyclohexene oxide-containing compounds or cyclopentene oxide-containing compounds produced by epoxidizing a cyclohexene ring-containing compound or cyclopentene ring-containing compound with a proper oxidizing agent such as hydrogen peroxide and peracid. Typical examples of polyglycidyl ether include one which is produced by the reaction between hydrogenated bisphenol A or alkylene oxide adduct thereof and epichlorohydrin. In addition, preferred aliphatic epoxy resins include polyglycidyl ethers of an aliphatic polyhydric alcohol or alkylene oxide adduct thereof. Their typical examples include diglycidyl ether of 1,6-hexanediol, triglycidyl ether of glycerin, diglycidyl ether of polyethylene glycol, diglycidyl ether of polypropylene glycol, and polyglycidyl ether of polyether polyol obtained by adding one or more kinds of alkylene oxide (e.g., ethylene oxide and propylene oxide) to an aliphatic polyhydric alcohol (e.g., ethylene glycol, propylene glycol, and glycerin). The above-mentioned epoxy resins may be incorporated with a diluent such as monoglycidyl ether of an higher aliphatic alcohol and a monoglycidyl ether of phenol or cresol or polyether alcohol obtained by adding alkylene oxide thereto.

The above-mentioned aromatic epoxy resins, alicyclic epoxy resins, and aliphatic epoxy resins may be used individually as the cationically polymerizable substance in the the curable composition of this invention. However, they may be properly combined with one another according to the desired performance.

The onium salt of a Lewis acid, which is the other essential constituent in this invention, is represented by the following formula.

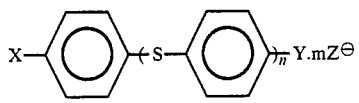  (I)

[where X is a sulfonio group represented by the following formula (II)].

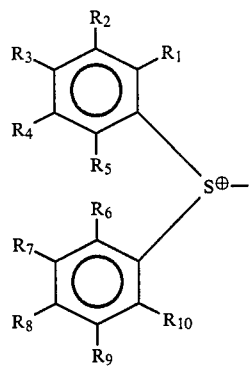  (II)

$R_1$–$R_{10}$ are independently selected from various kinds of groups excluding basic groups such as amino groups. Preferably, they are a hydrogen atom, halogen atom (e.g., F, Cl, Br, and I), nitro group, alkoxy group (e.g., $CH_3O$— and $C_2H_5O$—), $C_1$-$C_{18}$ aliphatic group (e.g., hydrocarbon group such as $CH_3$—, $C_2H_5$—, and $(CH_3)_2CH$—; cyclic hydrocarbon group such as cyclohexyl group; and those which contain a hetero atom in the main chain or substituent group (e.g.,

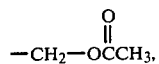

—S—$CH_3$, —O—$CH_2$—$CH_2$—OH, —O—$CH_2$Ph, and

or substituted or unsubstituted phenyl group, phenoxy group, or thiophenoxy group.

To achieve the object of the invention, at least one of $R_1$-$R_{10}$ is (A) a $C_1$-$C_{18}$ aliphatic group having at least one hydroxyl group or (B) a $C_3$-$C_{19}$ aliphatic group having a group of —$OCH_2CH_2O$—.

The substituent group belonging to (A) includes monoalcohol and polyalcohol represented by, for example, —$CH_2OH$, —$CH_2CH_2OH$, —O—$CH_2$—$CH_2$—$CH_2$—$CH_2$—OH, —$SCH_2CH_2OH$,

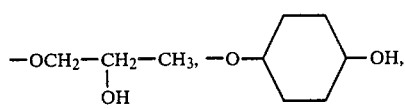

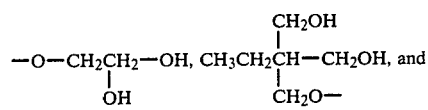

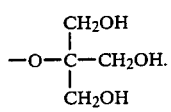

Examples of the substituent groups belonging to (B) include —$CH_2O$—$CH_2$—$CH_2$—O—$CH_3$,

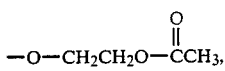

—(O—$CH_2CH_2$)$_2$OH, —(O—$CH_2CH_2$)$_2OCH_3$, and —(OCH$_2$CH$_2$)$_3$OH.

$R_1$ to $R_{10}$ may be any of the substituent groups defined by (A) and (B). Where eight or nine of $R_1$ to $R_{10}$ are hydrogen atoms, $R_3$ and/or $R_8$ should be the substituent groups defined by (A) and (B), for the ease of synthesis.

Y in the above formula (I) is a group represented by the formula (II), or a hydrogen atom, halogen atom, nitro group, alkoxy group, $C_1$-$C_{18}$ aliphatic group, $C_6$-$C_{18}$ substituted or unsubstituted phenyl group, phenoxy group, or thiophenoxy group (which are all defined as above).

n is an integer of 1 to 3, and m is an integer of 1 to 2. Where Y is a sulfonio group represented by the formula (II), m is 2.

Z is a group represented by the formula $MQ_l$ (III) or the formula $MQ_{l-1}OH$ (IV). (where M denotes B, P, As, or Sb; Q denotes a halogen atom (preferably Cl or F); and l is an integer of 4 to 6. Examples of Z include $BF_4$, $PF_6$, $AsF_6$, $SbF_6$, and $SbF_5OH$.

The onium salt of a Lewis acid used in this invention may be synthesized by (i) the reaction to form a sulfonium salt from a starting material having the desired substituent group, or by (ii) synthesizing an adequate substituted or unsubstituted group sulfonium salt and subsequently converting or introducing the substituent group.

Examples of the onium salt of Lewis acid represented by the formula (I) are given below.

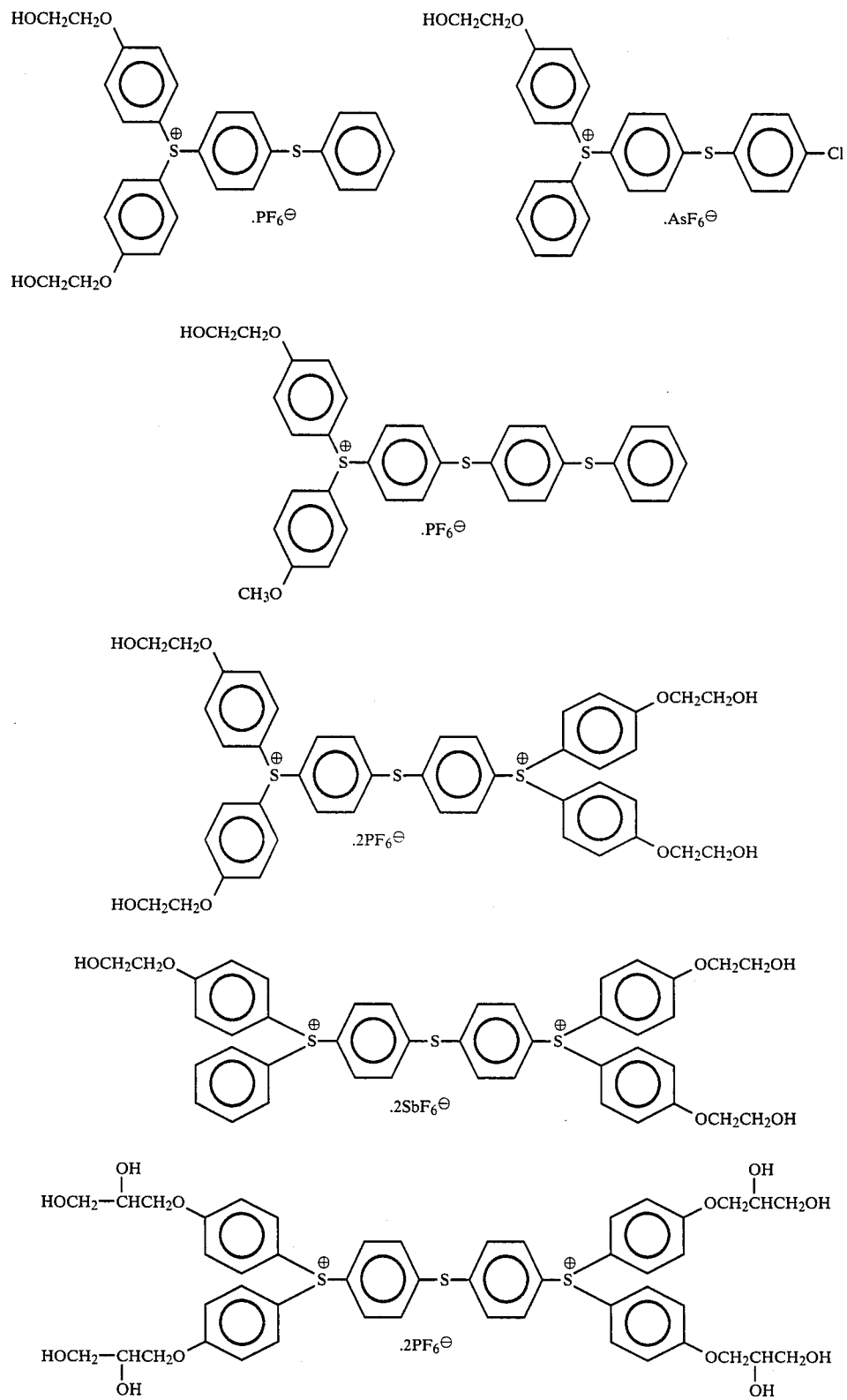

-continued

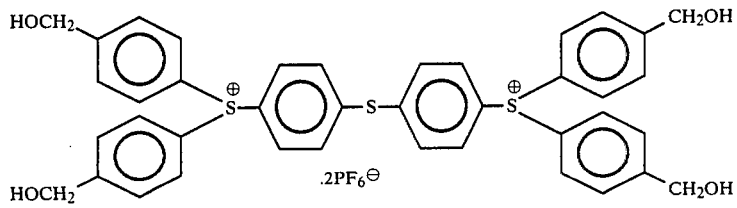

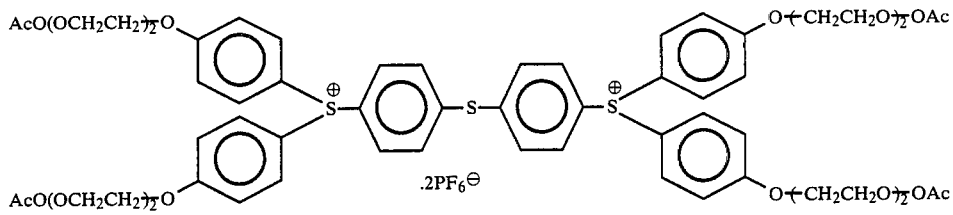

The curable composition of this invention is composed essentially of 100 wt. parts of a cationically polymerizable substance and 0.1 to 15 parts by weight, preferably 0.4 to 8 parts by weight, of the onium salt of Lewis acid represented by the formula (I). The adequate ratio is determined according to the type and dosage of energy beam and other many factors such as desired cure time, temperature, humidity, and coating thickness.

The curable composition of this invention is a liquid having a viscosity of 1 to 100,000 centipoise at 25° C. or a solid soluble in a solvent. Upon irradiation of energy beam such as ultraviolet light, it becomes dry to touch or solvent-insoluble within a tenth of minute to several minutes.

The energy beam is not specifically limited so long as it has sufficient energy to induce the decomposition of an initiator. The preferred energy beam is an electromagnetic wave energy beam having a wavelength of 2000 Å to 7000 Å produced by a high- or low-pressure mercury-vapor lamp, xenon lamp, bacteriocidal lamp, and laser; electron beam and X rays.

The exposure to an energy beam is usually 0.5 seconds to 10 seconds, depending on the intensity of the energy beam used. Exposure longer than this may be desirable for thick coatings. A tenth of second to several minutes after irradiation, the composition becomes dry to touch through the cationic polymerization. Irradiation may be preferably accompanied by heating to promote the cationic polymerization.

The composition of this invention may be incorporated with a solvent for dilution and an inert resin or prepolymer for modification, so long as they do not adversely affect the cationic polymerization. In addition, the composition may be incorporated with an organic carboxylic acid or acid anhydride for the improvement of electrical properties, or blended with a polyol or flexible prepolymer to impart rubbery resilience.

The composition of this invention is usually a transparent liquid; and it may be incorporated with an inert pigment, dye, filler, antistatic agent, flame retardant, gelation inhibitor, flow regulator, surface active agent, adhesion improver, processing aid, viscosity adjustor, sensitizer, ultraviolet light absorber, and the like, according to the intended use. The amount of these additives depends on the performance required and the curing characteristics.

The composition of this invention can be applied to metal, wood, rubber, plastics, glass, and ceramics.

The composition of this invention will find use as paint, ink, adhesive, molding material, casting material, glass fiber impregnant, putty, and sealer. It can also be applied to electrical materials because of the superior electrical properties of epoxy resins. The major applications include capacitor, resistance, light emitting diode, semiconductor, printed board, transformer, motor, wire, solar battery, relay, switch, and other electrical and electronic parts. In addition, the composition will find use in the optical application because of its good clarity.

The composition of this invention cures in a short time upon irradiation with an energy beam, and it passes into a cured product having good physical properties, forming very little amount of low molecular weight compound that causes an offensive odor and adversely affects the properties of the coating film.

EXAMPLES

The invention is now described in more detail with reference to the following examples, which are not intended to limit the scope of the invention.

Example 1

4,4'-bis-[bis(p-fluorophenyl)sulfonio]phenylsulfide-bishexafluorophosphate was stirred in a large excess of ethylene glycol in the presence of sodium hydroxide at room temperature for 1 day. The reaction mixture was poured into water to give a light-yellow oily substance. This substance was washed with water several times and then purified by silica gel column chromatography. Thus there was obtained white solid in a yield of 70%. This substance was identified by $^{13}C$—NMR, $^3H$—NMR, and IR as 4,4'-bis[bis(p-2-hydroxyethoxyphenyl)sulfonio]phenylsulfide-bishexafluorophosphate (Compound 1). (The results of $^{13}C$—NMR were: 163.3, 140.3, 133.3, 132.4, 131.3, 126.0, 117.3, 114.6, 70.5 and 59.2 ppm, TMS as the internal reference and DMSO-$d_6$ as the solvent.)

The above-mentioned procedure was repeated, except that ethylene glycol was replaced by carbitol, to give 4,4'-bis[bis(p-1,4,7-trioxanonylphenyl)sulfonio]-phenylsulfide-bishexafluorophosphate (compound 2).

For comparison, the following compounds were synthesized by the known process. Triphenylsulofonium-hexafluorophosphate (compound 3); diphenyl-4-thiophenoxyphenylsulfonium-hexafluorophosphate (compound 4): and bis[4-(diphenylsulfonio)phenyl]sulfide-bishexafluorophosphate (compound 5). [Journal of Polymer Science, Polymer Chemistry Edition, Vol. 18, p. 2677, 1980; Vol. 22, p. 1789, 1984].

The above-mentioned five compounds were examined for photodegradation in the following manner. Each compound was dissolved in a methanol-water mixture (1:9) to give a 2000 ppm solution. The solution was exposed to ultraviolet light emitted by four fluorescent lamps FL6E (6 W) (made by Sankyo Denki Co., Ltd.) placed 10 cm away, for 30 minutes. The low-molecular weight compounds formed by exposure were identified by gas chromatography. The column was Tenax GC (1 m), and the temperature was raised from 150° C. to 270° C. at a rate of 15° C./min. The results are shown in Table 1.

TABLE 1

| | Identification of Decomposition Product | | | | |
|---|---|---|---|---|---|
| | Compd 1 | Compd 2 | Compd 3 | Compd 4 | Compd 5 |
| Diphenyl sulfide | <0.5% | <0.5% | 30% | 25% | 31% |
| Diphenyl sulfoxide | <0.5% | <0.5% | 6% | 8% | 5% |
| Others* | <2% | — | — | — | — |

*Low-molecular weight compounds having a molecular weight lower than 200.

The decomposition products of Compound 1 were identified as bis(p-2-hydroxyethoxyphenyl)sulfide (about 20%) and bis(p-2-hydroxyethoxyphenyl)sulfoxide (about 5%). These compounds are all odorless solids.

Example 2

Compound 1 and compound 5 were individually dissolved in propylene carbonate to give 33% solutions. Each of the solution (5.77 parts by weight and 4.5 parts by weight) was added to an epoxy resin formulation composed of 80 parts by weight of Celloxide 2021 (alicyclic epoxy resin made by Daicel Chemical Ind. Ltd.) and 20 wt. parts of DY-022 (butanediol-diglycidyl ether being available from Nagase Sangyo Co., Ltd.).

The resulting mixture was applied to an aluminum test panel (in coating thickness of 10 μm), and the coating was irradiated with a high-pressure mercury-vapor lamp, whereby a cured coating was obtained. The coating film was examined for elusion according to the method stipulated in the Food Sanitation Law (Notification No. 20 of the Ministry of Public Welfare, February 1982). The amount of residues on evaporation was measured. The results are shown in Table 2.

TABLE 2

| Amount of Residues on Evaporation | | |
|---|---|---|
| Conditions of extraction | Compound 1 | Compound 5 |
| 20% alcohol, 60° C., 30 min. | <10 ppm | 15 ppm |
| Water, 95° C., 30 min. | <10 ppm | 20 ppm |
| n-heptane, 25° C., 60 min. | <10 ppm | <10 ppm |
| 4% acetic acid, 60° C., 30 min. | <10 ppm | 17 ppm |

In the case of compound 5, 0.1 to 0.4 ppm of diphenyl sulfide was detected in the evaporation residues; but in the case of compound 1, it was not detected at all, nor bis(p-2-hydroxyethoxyphenyl)sulfide.

Example 3

In 100 g of ERL-4221 (alicyclic epoxy resin, made by Union Carbide Corp.) was dissolved 3.4 mmol of the compound of Example 1 (1.7 mmol in the case of bis-sulfonium salt). The resulting solution was applied to an aluminum test panel (in coating thickness of 5 μm), and the coating film was irradiated with a high-pressure mercury-vapor lamp (80 W/cm) placed 10 cm away. The tack-free time (time for the coating film to dry to touch) was measured. The results are shown in Table 3. The compositions were good in storage stability, with no increase in viscosity after storage at 40° C. for 3 months.

TABLE 3

| Tack-free Time | | | | |
|---|---|---|---|---|
| Compound 1 | Compound 2 | Compound 3 | Compound 4 | Compound 5 |
| 2 sec. | 2 sec. | 5 sec. | 2 sec. | 2 sec. |

Example 4

The following epoxy resin formulations 1 and 2 were prepared. Formulation 1: 80 parts of ERL-4221 and 20 parts of DY-022 Formulation 2: 20 parts of ERL-4221, 60 parts of Ep-4100 (bisphenol A epoxy resin, made by Asahi Denka Co., Ltd.), and 20 parts of DY-022.

To 100 g of each formulation was added 1.7 mmol of compound 1. In comparative examples, to 100 g of each formulation was added 3.4 mmol of tris(p-hydroxyphenyl)sulfonium-hexafluorophosphate having the phenolic hydroxyl group (compound 6). The resulting composition was examined for curing characteristics in the same manner as in Example 3. The cured coating film was exposed to a bacteriocidal lamp for 100 hours to examine the yellowing of the coating film. The results are shown in Table 4.

TABLE 4

| | Compound 1 | Compound 2 |
|---|---|---|
| Tack-free time | | |
| Formulation 1 | 2 sec. | 5 sec. |
| Formulation 2 | 10 sec. | >60 sec. |
| Color of coating film | | |
| Formulation 1 | Good | Greatly yellowed |
| Formulation 2 | Good | Greatly yellowed |

What is claimed is:

1. An energy beam curable resin composition which comprises as essential constituents a cationically polymerizable substance and an effective amount of an onium salt of a Lewis acid represented the following formula (I)

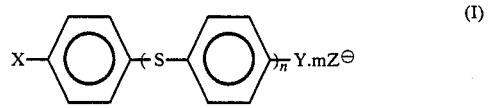

where X is a sulfonio group represented by the following formula (II)

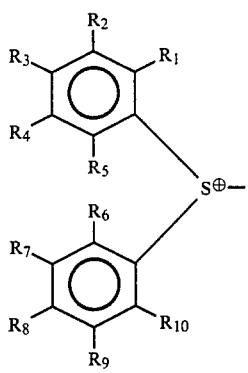

(II)

where $R_1$–$R_{10}$ are each a hydrogen atom, halogen atom, nitro group, alkoxy group, $C_1$–$C_{18}$ aliphatic group, or $C_6$–$C_{18}$ substituted or unsubstituted phenyl, phenoxy, or thiophenoxy group, with at least one of $R_1$–$R_{10}$ being (A) a $C_1$–$C_{18}$ aliphatic group having at least one hydroxyl group or (B) a $C_3$–$C_{19}$ aliphatic group having a group of —OCH$_2$CH$_2$O—;

Y is a group represented by the above formula (II), hydrogen atom, halogen atom, nitro group, alkoxy group, $C_1$–$C_{18}$ aliphatic group, $C_6$–$C_{18}$ substituted or unsubstituted phenyl, phenoxy, or thiophenoxy group, and n=1–3 and m=1–2; and Z is a group represented by the formula MQ$_l$ (III) or the formula MQ$_{l-1}$OH (IV), where M denotes B, P, As, or Sb; Q denotes a halogen atom; and l is an integer of 4 to 6.

* * * * *